United States Patent
Morris et al.

(10) Patent No.: US 7,081,793 B2
(45) Date of Patent: *Jul. 25, 2006

(54) HIGH-EFFICIENCY AMPLIFIER, CONVERTER AND METHODS

(75) Inventors: Bradley John Morris, Ottawa (CA); Arthur Thomas Gerald Fuller, Kanata (CA); Russell Smiley, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

This patent is subject to a terminal disclaimer.

(21) Appl. No.: 10/858,079

(22) Filed: Jun. 2, 2004

(65) Prior Publication Data

US 2005/0062526 A1 Mar. 24, 2005

Related U.S. Application Data

(63) Continuation-in-part of application No. 10/449,105, filed on Jun. 2, 2003.

(51) Int. Cl.
   *H03F 3/38* (2006.01)
(52) U.S. Cl. ......................... 330/10; 330/251
(58) Field of Classification Search ............ 310/10, 310/124 R, 295, 207 A, 251, 302
   See application file for complete search history.

(56) References Cited

U.S. PATENT DOCUMENTS

| 6,734,725 B1 * | 5/2004 | Masuda et al. ............... 330/10 |
| 6,747,517 B1 * | 6/2004 | Lautzenhiser et al. ...... 330/295 |
| 2002/0053945 A1 | 5/2002 | Putzeys |

OTHER PUBLICATIONS

Watanabe, S. et al., "DSP-based High Precision Current Tracking Control of Gradient Coil in Two-Paralleled PWM Amplifiers for MRI Systems". Power Electronics Specialists Conference, 1998. PESC 98 Record. 29th Annual IEEE Fukuoka, Japan May 17-22, 1998. New York, NY USA. pp. 916-921, XP010294962. ISBN: 0-7803-4489-8.

(Continued)

*Primary Examiner*—Henry Choe

(57) ABSTRACT

Methods and apparatus are provided for efficiently amplifying or converting a signal. An input signal is decomposed into a plurality of two state signals, each two state signal having a respective on level and off level. This may involve sigma-delta modulation and phase splitting. For amplifier applications, each of the two state signals is amplified with a respective switching power amplifier to produce a respective amplified signal. The amplified signals are combined to produce an amplified version of the input signal. Signals may be adjusted for impairments associated with a subsequent processing operation such as the combining.

51 Claims, 6 Drawing Sheets

OTHER PUBLICATIONS

Antunes, V. M. E., et al., "Harmonic Distortion Reduction in Multi-Level PWM Modulators for Audio Power Amplifiers". IECON-2002. Proceedings of the 28$^{th}$ Annual Conference of the IEEE Industrial Electronics Society. New York, NY. IEEE USA vol. 1 of 4. Nov. 5, 2002. pp. 852-857, XP010633268. ISBN: 0-7803-7474-6.

Iwamoto, M.; Jayaraman, A.; Hanington, G.; Chen, P.F.; Bellora, A.; Thornton, W.; Larson, L.E..; Asbeck, P.M.; Bandpass Delta-Sigma Class-S Amplifier; Electronics Letters, vol. 36, No. 12; Jun. 12, 2000; pp. 1010-1012.

Tousi, Vahid M.; Sahandi, F.; Atarodi, M.; Shojaei, M.; A 3.3.V/1W Class D Audio Power Amplifier with 103Db DR and 90% Efficiency; IEEE, 200, pp. 581-584.

Jayaraman, Arun; Chen, P.F.; Hanington, G.; Larson, L., Asbeck, P.; Linear High-Efficiency Microwave Power Amplifiers Using Bandpass Delta-Sigma Modulators; IEEE, 1998, pp. 121-123.

Keyzer, J.; Hinrichs, J.; Metzger, M.; Iwamoto, I.; Galton, I.; Asbeck, P.; Digital Generation of RF Signals for Wireless Communications with Band-Pass Delta-Sigma Modulation; IEEE, 2001; pp. 2127-2130.

Aziz, Pervez M.; Sorensen, Henrik V.; Van Der Spiegel, Jan; An Overview of Sigma-Delta Converters; IEEE Signal Processing Magazine, Jan. 1996; pp. 61-84.

* cited by examiner

HIGH-EFFICIENCY AMPLIFIER, CONVERTER AND METHODS

CROSS-REFERENCE TO RELATED APPLICATION

This application is a continuation-in-part of U.S. patent application Ser. No. 10/449,105, filed on Jun. 2, 2003, entitled "HIGH-EFFICIENCY AMPLIFIER AND METHOD", and incorporated in its entirety herein by reference.

FIELD OF THE INVENTION

The invention relates to high-efficiency amplifiers, high-performance and high-frequency digital to analog converters, and methods.

BACKGROUND OF THE INVENTION

Power amplifiers account for a significant portion of the capital and operational expense in current wireless base station designs. One method of reducing this expense is to increase the overall efficiency of these amplifiers. In order to obtain high-efficiency amplifiers, one approach which has been tried is to modulate the amplifier's PSU (power supply unit) in order to track the input envelope of the modulated signal. This in turn requires that one must have a high-efficiency PSU which supports the desire to modulate the PSU, while at the same time, does not introduce any impairments into the main signal path.

A number of high-efficiency architectures have been proposed, particularly in the audio field. However, these architectures typically consist of a single phase and are not capable of supporting the power levels and input bandwidths required for RF applications.

Improvements in efficiency of power amplifiers would benefit low-frequency, high-frequency and radio-frequency amplifier applications.

Sigma-Delta modulation allows noise shaping such that the noise of the modulated signal lies mostly out-of-band. Filtering off the out-of-band noise substantially restores the original signal. See for example Sharp "An Overview of Sigma-Delta Converters", (IEEE Signal Processing Magazine, January 1996), SM-SX1 Sigma-Delta Audio Amplifier (IEEE Spectrum, March 2000), "Bandpass delta-sigma class-S amplifier", Electr. Letters, Vol. 36, No. 12, June 2000, "Linear High-Efficiency Microwave Power Amplifiers Using Bandpass Delta-Sigma Modulators", Jayaraman et al., IEEE Micr. & Guided Wave Letters, Vol. 8, No. 3, March 1998, "Linear Amplification by Sampling Techniques: A new application for Delta Coders", Cos, IEEE Trans. Comm., Vol. Com-23, No. 8, August 1975. Conventional applications for Sigma-Delta modulation have focussed on analog inputs, and have produced single-bit outputs only. Single bit systems require a very high over-sampling rate to achieve acceptable performance. Multi-bit Sigma-Delta modulators have also been proposed. Sigma-Delta modulation takes an input signal and converts it to an N-level quantized Sigma-Delta signal. The input signal can be in the form of an analog signal or a digital signal.

Sigma-Delta modulation techniques have also been applied in digital to analog conversion. Conventional Multi-bit Sigma-Delta digital to analog converters utilize a multi-bit quantizer to drive a feedback loop and a final digital to analog conversion stage (see P. Aziz, R. Sorensten, and J. van der Spiegel, "An Overview of Sigma-Delta Converters", IEEE Signal Processing Magazine, January 1996, pp. 61–84, for example). In the case of a two level Sigma-Delta modulator, the quantizer and the output digital to analog converter (DAC) may be merged as a comparator. Although two level quantizers possess desirable features of simplicity and inherent linearity, a two level quantizer significantly limits achievable performance in terms of loop stability, output noise level, signal-to-noise ratio (SNR) and dynamic range.

Multi-bit quantizers may offer an improvement in the achievable SNR of 6 dB per bit and improve the maximum input signal level while maintaining loop stability. Together, this results in a significant improvement in SNR and dynamic range performance. The main trade-off is that the DAC required to convert the multi-level output is not inherently linear and must be as good as the target output performance.

For example, if a Sigma-Delta modulator is designed to achieve 16 bit performance, the output DAC would have to achieve this level of performance (accuracy of levels, etc.), even though it might only have a small number of bits (i.e., 2–5). This leads to significant complications and limitations in the development of high performance, high frequency, multi-bit Sigma-Delta digital to analog converters.

Additionally, the multi-level analog output limits the applications of the converters. In high power applications such as in audio or RF amplifiers for instance, it is desirable to use two level outputs to drive switching power stages to achieve high efficiency. This limits the application of Sigma-Delta modulators to single bit quantizers. In M. Neitola, A. Kivi, and T. Rahkonen, "Design of a Wideband Transmit Delta-Sigma DAC", IEEE Conference on Electronics, Circuits, and Systems, September 2001, pp. 1053–1056, for example, a final DAC is used even when an experimental platform, a Field Programmable Gate Array (FPGA) in this case, is entirely digital. Other approaches attempt to address the issues surrounding multi-bit linearity in the output stage in Sigma-Delta DACs, but similarly fail to overcome the above limitations. One such approach is described in T. Shui, R. Schreier, and F. Hudson, "Mismatch Shaping for a Current-Mode Multbit Delta-Sigma DAC", IEEE Journal of Solid-State Circuits, Vol. 34, No. 3, March 1999, pp. 331–338.

SUMMARY OF THE INVENTION

According to a broad aspect, there is provided a method comprising decomposing an input digital signal into a plurality of phase signals, each phase signal having a respective on level and off level, and combining the phase signals to produce as an output signal an analog version of the input digital signal.

The method may also include adjusting at least one of the phase signals, prior to combining, to reduce effects of an impairment of the combining, to thereby produce at least one adjusted phase signal. In some embodiments, adjusting comprises determining an adjustment factor and applying the adjustment factor to the at least one of the phase signals.

An adjustment factor may be determined by reading the adjustment factor from a lookup table, or determining a characteristic of a phase signal, the output signal, or an intermediate signal produced during the combining and then determining the adjustment factor based on the characteristic, for example. A signal characteristic may be further processed using an algorithm in order to calculate the adjustment factor. An adjustment factor may also be stored in a lookup table for subsequent use. Phase signals may be adjusted collectively or separately.

Decomposing may involve processing the input digital signal with an N level Sigma-Delta modulator to produce a quantized signal having N levels, where N≧3, and performing a phase splitting function on the quantized signal to produce N−1 signals, the plurality of phase signals consisting of the N−1 signals.

The decomposing of an input digital signal may be performed subject to a minimum on time constraint for each phase signal, a minimum off time constraint for each phase signal, or a minimum and/or maximum time between transitions, or to equalize numbers of transitions between the plurality of phase signals.

The operation of performing a phase splitting function on the quantized signal to produce N−1 signals may include, for each quantized signal output "currentIn", if currentIn is the same as a previously processed quantized signal output "lastIn", making no changes to the, plurality of phase signals, if currentIn is less than lastIn, determining a set X of signals that are currently off are determined, from that set X, selecting the signals with the least number of switching events and activating the selected signals, and if currentIn is greater than lastIn, determining a set X of signals that are currently, from the set X, selecting the phases with the least number of switching events and deactivating the selected signals.

In some embodiments, a partial filtering function is performed on each phase signal prior to combining the phase signals. A final filtering function may performed on the output signal.

In some embodiments, the phase signal are amplified with respective switching power amplifiers to produce respective amplified signals, and adjusting may then include adjusting at least one of the amplified signals. Respective power amplifiers may instead be used to amplify each of the at least one adjusted phase signals and the plurality of phase signals other than the at least one phase signal.

A system is provided in a further broad aspect, and includes means for decomposing a digital signal into a plurality of phase signals, each phase signal having a respective on level and off level, and means fox combining the phase signals to produce as an output signal an analog version of the digital signal.

In yet another broad aspect, there is provided an apparatus comprising a signal decomposing circuit adapted to decompose an input digital signal into a plurality of phase signals, each phase signal having a respective on level and off level, and a combiner adapted to combine the phase signals to produce as an output signal an analog version of the input digital signal.

The system may also include a phase corrector adapted to adjust at least one of the phase signals to reduce effects of an impairment of the combining, to thereby produce at least one adjusted phase signal. The phase corrector may be adapted to adjust the at least one of the phase signals by determining an adjustment factor, such as by reading the adjustment factor from a lookup table in a memory or determining the adjustment factor based on a signal characteristic, and applying the adjustment factor to the at least one of the phase signals. The system may also include a sensor for determining the signal characteristic and providing the characteristic to the phase corrector.

The signal decomposing circuit may include an N level Sigma-Delta modulator which produces a quantized signal having N levels, where N≧3, and a phase splitting function adapted to process the quantized signal to produce N−1 signals, the plurality of phase signals consisting of the N−1 signals. In some embodiments, the signal decomposing circuit decomposes the input digital signal in a manner which substantially equalizes numbers of transitions between the phase signal, or subject to a minimum on time constraint for each phase signal, a minimum off time constraint for each phase signal, a minimum and/or maximum time between transitions.

The phase splitting function may be adapted to, for each quantized signal output "currentIn", if currentIn is the same as a previously processed quantized signal output "lastIn", make no changes to the plurality of phase signals, if currentIn is less than lastIn, determine a set X of signals that are currently off are determined, from that set X, select the signals with the least number of switching events and activate the selected signals, and if currentIn is greater than lastIn, determine a set X of signals that are currently, from the set X, select the phases with the least number of switching events and deactivate the selected signals.

A method according to another broad aspect of the invention includes decomposing an input signal into a plurality of two state signals, each two state signal having a respective on level and off level, and adjusting the two state signals to reduce effects of a subsequent processing operation, to thereby produce at least one adjusted phase signal.

A related apparatus includes a signal decomposing circuit adapted to decompose an input signal into a plurality of two state signals, each two state signal having a respective on level and off level, and a corrector adapted to adjust the two state signals to reduce effects of a subsequent processing operation, to thereby produce at least one adjusted phase signal.

Each of the adjusted two state signals may be amplified with a respective switching power amplifier to produce a respective amplified signal. Alternatively, each of the two state signals may be amplified with a respective switching power amplifier to produce a respective amplified signal, in which case the amplified signals are adjusted.

In one embodiment, the subsequent processing operation is combining the adjusted signals in a combiner.

The two state signals may be adjusted collectively, using a common adjustment factor, for example, or separately, such as by using respective adjustment factors.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
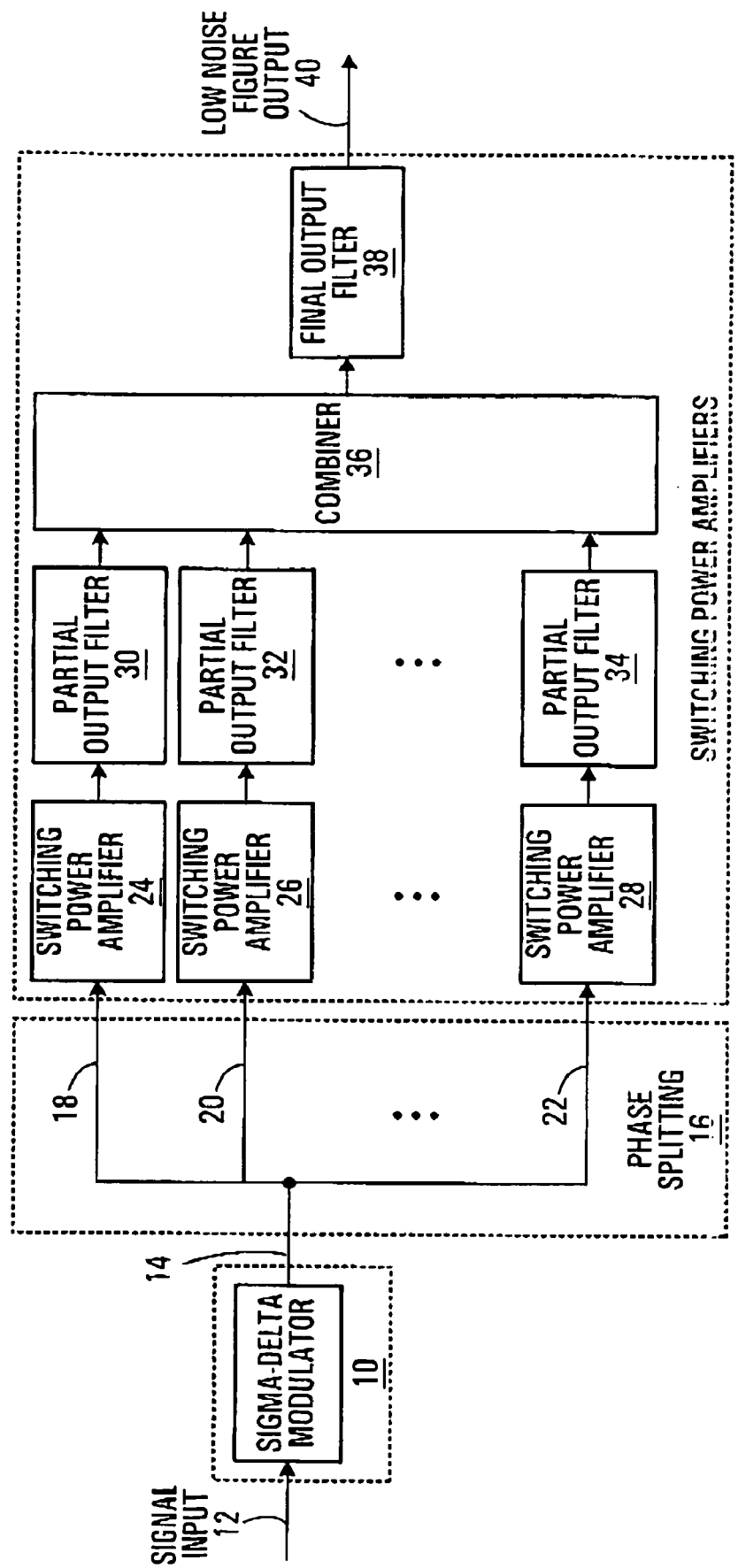
FIG. 1 is a block diagram of an amplifying system provided by an embodiment of the invention.

Referring now to FIG. 1, shown is a block diagram of a high-efficiency amplification system using an N-level Sigma-Delta modulator, N≧3 as provided by an embodiment of the invention. The Sigma-Delta modulator 10 is connected to receive an input signal and produce an N-level Sigma-Delta modulated output signal 14. A phase splitting function generally indicated at 16 takes the Sigma-Delta modulated signal 14 and produces a set of N−1 "phases" 18,20,22 (only three shown). The N−1 phases 18,20,22 collectively sum to equal the Sigma-Delta modulated signal 14 at any instant. Each of the N−1 phases 18,20,22 is connected to the input of a respective one of N−1 switching power amplifiers 24,26,28 (only three shown). The outputs of the switching power amplifiers 24,26,28 are connected to respective partial output filters 30,32,34 (only three shown). The outputs of the partial output filters 30,32,34 are connected to inputs of a combiner 36 having an output connected to a final output filter 38 which produces the overall output 40. The Sigma-Delta modulator 10 provides the benefit of noise shaping as compared to other modulation techniques, allowing a reduction in the number of output levels relative to a number of input levels while maintaining performance. In this way, quantization noise is "pushed" out of the band of interest, allowing it to be eventually filtered off without negatively impacting the desired signal.

In operation, the Sigma-Delta modulator 10 processes the input signal to produce the Sigma-Delta modulated signal 14. The input signal can be an analog signal or a digital signal, and this will of course affect the implementation Sigma-Delta modulator. In the case of a digital input signal, the need for a final analog to digital converter in the modulator 10 to produce digital output signals for driving the amplifiers 24,26,28 is removed. For RF amplifier applications, for example, the input signal is an analog or digital RF signal to be amplified. For power supply unit applications (described in detail below), the input signal is the envelope of an RF input signal. The sigma-delta modulated signal 14 consists of an N level quantized signal representable by $\log_2(N)$ bits. Of course, where $\log_2(N)$ is not an integer, the number of bits is preferably the next larger integer.

It is noted that N does not necessarily have to be a power of 2. For example, if there are four levels, then the output of the Sigma-Delta modulator 14 can be represented by two bits. The phase splitting function 16 processes the Sigma-Delta modulated signal 14 to produce signal phases 18,20,22 which sum to equal the Sigma-Delta modulated signal. However, each of the phase signals is a two state signal meaning that it is either on or off and each of the phase signals 18,20,22 has an on state which will saturate the respective switching power amplifier 24,26,28 to which it is fed. Thus, signal phase 18 has an on state which will saturate switching power amplifier 24, phase 20 will have an on state which will saturate switching power amplifier 26, and signal phase 22 will have an on state which will saturate switching power amplifier 28. In a preferred embodiment, the on states for the N−1 phases produced in the phase splitting block 16 are equal so that the N−1 switching power amplifiers 24,26, 28 can be made identical. The phase splitting function 16 needs to produce N−1 2-level signals, where the Sigma-Delta modulator 10 produced an N level Sigma-Delta modulated signal 14. Several examples of the phase splitting function 16 are presented in detail below.

Each of the switching power amplifiers 24,26,28 perform switching power amplification on the respective input signals 18,20,22. Any suitable switching amplifier topology can be employed. Eligible topologies include but are not limited to class D, class S, class E and class E amplifiers, and buck, boost and flyback converters. The amplified signals produced by the switching power amplifiers 24,26,28 are filtered and partial output filters 30,32,34. The outputs of the partial output filters 30,32,34 are summed with combiner 36. This can be implemented with any suitable combining technology. The combiner produces a combined signal which is output to the final output filter 38 which filters out-of-band noise to produce the overall output 40.

The partial output filters and the overall output filter achieve an overall filter response. If the desired signal has a lowpass characteristic the overall filter response should be lowpass. If the desired signal is bandpass the overall filter should be bandpass. The filter matches the desired signal. Typically in the power supply or audio application the desired overall output filter response is lowpass. Those skilled in the art will know how to divide the overall response into two filters (a partial output filter and final output filter) that when combined achieved the desired overall response.

Figure 2:
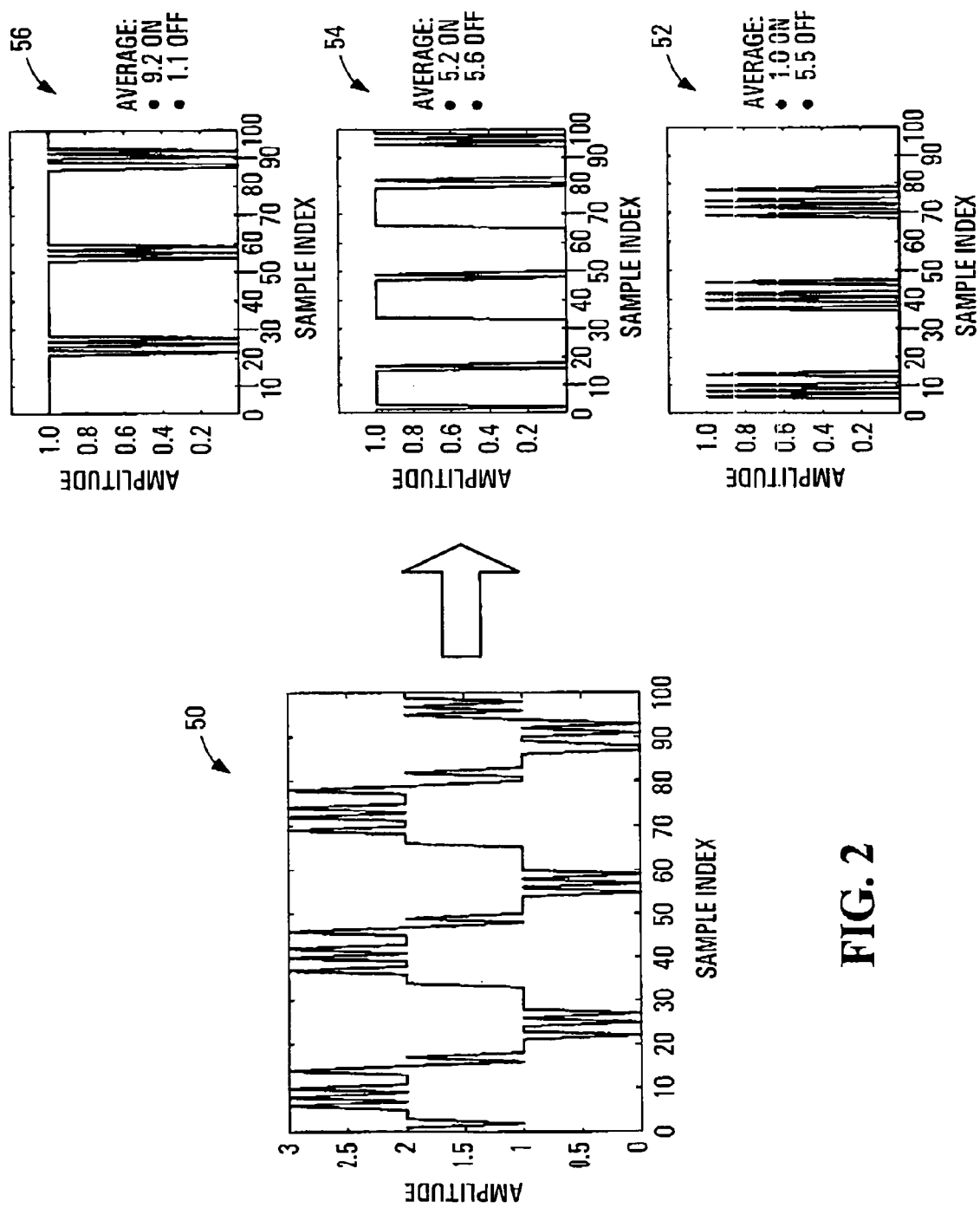
FIG. 2 is an example of how phase allocation can be performed by the phase splitting function of FIG. 1.

FIG. 2 shows a simple "thresholding" phase allocation scheme implementable in the phase splitting function 16. For this example, the Sigma-Delta modulated signal 14 of FIG. 1 is generally indicated by 50. It can be seen that this is a four level signal, with the output having either a value of 0, 1, 2, or 3 with appropriate brief transition periods between these Sigma-Delta states. With thresholding phase allocation, a first phase is simply defined to be any portion of the Sigma-Delta modulated signal greater than quantization level "2" and less than or equal to quantization level "3". An example of such a signal is indicated at 52. The next phase will simply be any portion of the signal greater than quantization level "1" and less than or equal to quantization level "2". An example of such a signal as indicated generally at 54. Finally, the third phase is simply that portion of the Sigma-Delta modulated signal which is greater than quantization level "0" and less than or equal to quantization level "1". An example of this is indicated generally at 56.

It can be seen that a sum of signals 52,54,56 would equal the signal 50. The three signals 52,54,56 are all substantially two state signals, oscillating between 0 and 1. In this example it is of course assumed that the on state has been normalized to 1. More generally, the on state would need to be a value which saturates the switching power amplifiers. This particular phase splitting methodology has the disadvantage that the switching power amplifier responsible for amplifying the lowest phase, namely the signal content between "0" and "1" will be on much more of the time than the switching power amplifier responsible for amplifying the largest phase 52. In the illustrated example, the average on time for the lowest phase is 9.2 samples and the average off time 1.1 samples. For the medium phase, the average on time is 5.2 samples and the average off time is 5.6 samples. Finally, the average on time for the highest phase 52 is 1 sample and the average off time is 5.5 samples. It is noted that in the illustrated example, the first phase 52 has more transitions than the third phase 56. The number of transitions affects efficiency.

In another embodiment, a more intelligent phase splitting method is employed in the phase splitting function 16. This method attempts to reduce the number of switching events that will occur in each of the resulting two-level signals while at the same time equalizing the switching events between the phases. If the modulator produces equal size quantization steps, then the output of the Sigma-Delta converter can be considered to indicate how mane phases of the converter need to be active, without specifying which of the phases are active. The phase splitting function 16 then allocates the on states between the phases to achieve desired switching characteristics. In a preferred implementation, there is a substantially equal distribution of on and off states among the phases. Reducing the number of transitions (off→on, on→off) increases the efficiency. Distribution of the phases can also be used to minimize distortion caused by differences between phases.

Other constraints can be imposed upon the phase splitting function 16. For example, there can be maximum on time or maximum off time for any of the switching power amplifiers.

Figure 4:
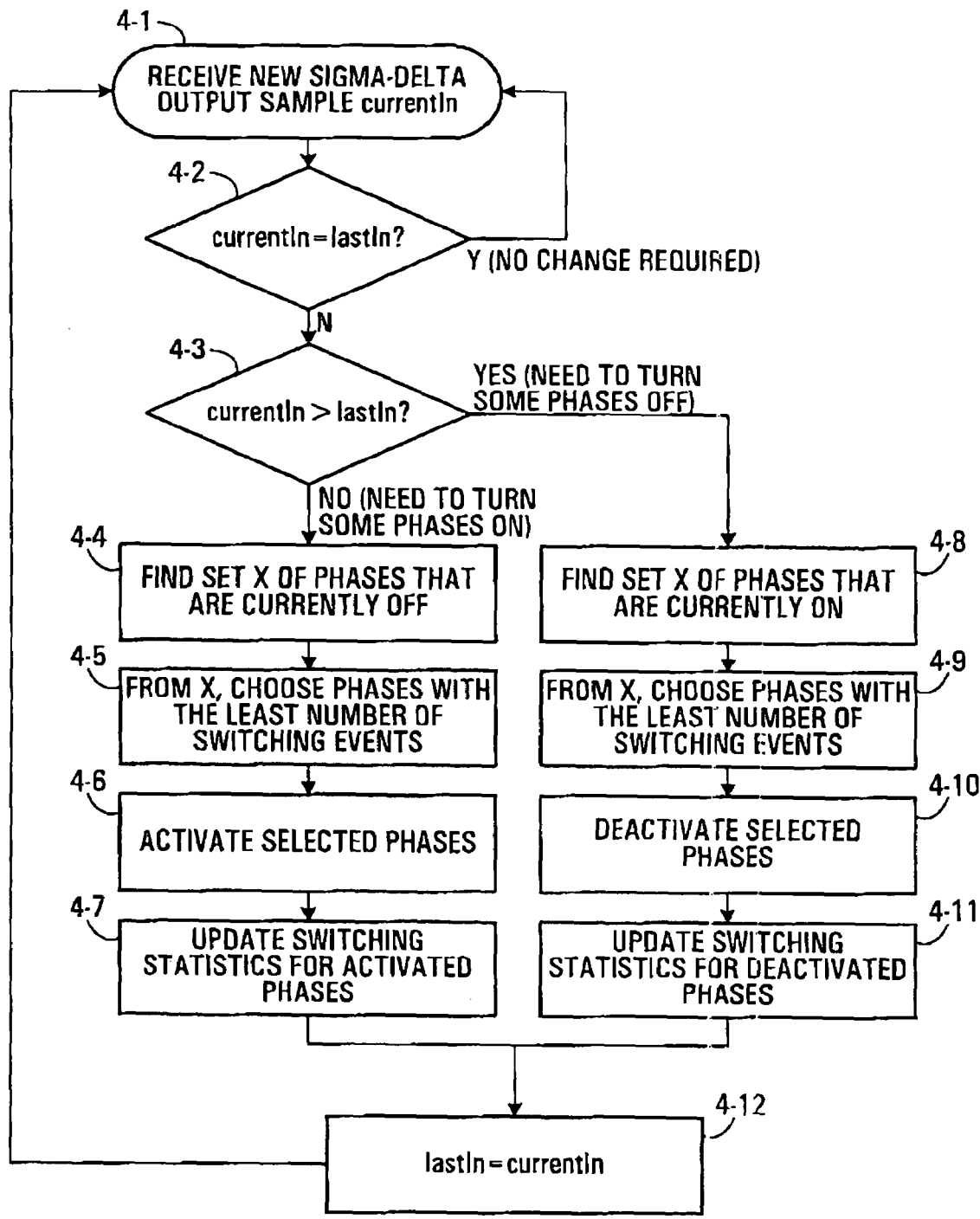
FIG. 4 is a flowchart of a method of phase allocation.

FIG. 4 is a flowchart of an example phase splitting function 16. The method begins at step 4-1 with the reception of a new Sigma-Delta output sample "currentIn". At step 4-2, if currentIn is the same as the previously processed sample referred to as "lastIn", (yes path) then the method returns to step 4-1 to process the next sample. Otherwise, an step 4-3, if currentIn is less than lastIn then some phases need to be turned off, and steps 4-8 through 4-11 are executed. Otherwise, if currentIn is greater than lastIn then some phases need to be turned on and steps 4-4 through 4-7 need to be executed. In either case, at step 4-11, lastIn is set to equal currentIn and used in subsequent processing.

In order to turn phases on, the set X of phases that are currently off are determined at step 4-4. Front that set X, the phases with the least number of switching events are selected at step 4-5. The selected phases are activated at step 4-6. Finally, at step 4-7, the switching statistics for the activated phases are updated.

Similarly, to turn phases off, at step 4-8, the set X of phases that are currently on is identified. At step 4-9, from the set X the phases with the least number of switching events are chosen. At step 4-10, the selected phases are de-activated. Finally, at step 4-11, the switching statistics for the de-activated phases are updated.

This is a very specific example which has, been found by experimentation to yield very good results. However, it is to be understood that many other methods of distributing the switching events between the different phases may be employed within the scope of the invention.

In the above-described embodiment, each phase includes a partial filter which eliminates some of the out-of-band noise signals. After the phases are combined, the final output filter 38 reduces any remaining out-of-bind noise signals to a desired level. In another alternative embodiment, there are no partial output filters 30,32,34. Rather, the outputs of the amplifier phases are directly combined so that the sum of each phase results in the original desired signal including out-of-band noise signals generated by the sigma-delta modulator 10. A filter is then applied to the combined output signal to exclude the out-of-band noise while retaining the desired original signal. In another alternative embodiment, each amplifier phase includes a respective filter that entirely excludes the out-of-band noise signal. The summation of the phases thus filtered would then only include the desired original signal. In this case, there would be no requirement for the final output filter 38 of FIG. 1.

Figure 3:
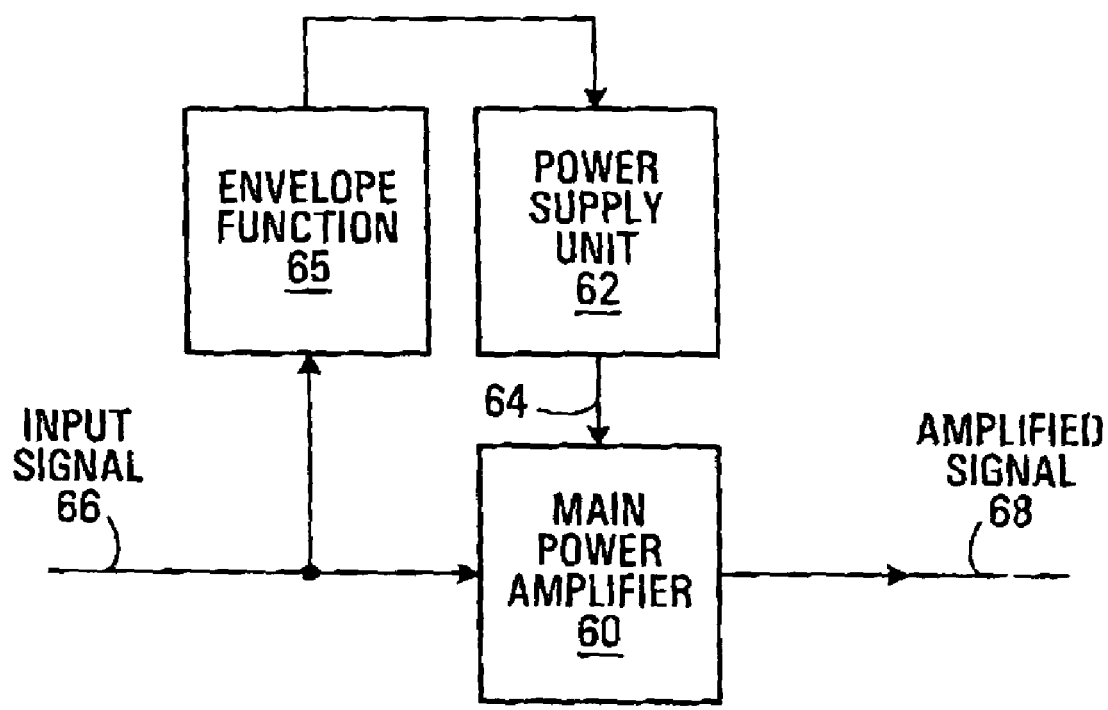
FIG. 3 is a block diagram of a power supply unit application of the amplifier of FIG. 1.

In the above-described embodiment, the new amplification approach has been applied directly to an input signal to produce an amplified output signal. In another embodiment, the method is applied to an N amplifier PSU in order to track the input envelope of the main amplifier. A block diagram of this embodiment is shown in FIG. 3. In this embodiment, shown is a main power amplifier 60 powered by a power supply unit 62. The power supply unit is a high-efficiency amplifier using Sigma-Delta modulation, for example as shown in FIG. 1. This generates a power supply signal 64 which powers the main power amplifier 60. The input signal 66 is amplified by the main power amplifier 60 to produce an amplified output signal 68. The input signal 66 is also fed through an envelope function 65 to the input of the power supply unit 62 such that the power supply signal 64 tracks the envelope of input signal.

The above example implementation has focussed on the use of a Sigma-Delta modulator to generate the quantized signal, and a phase splitting function 16 to generate the various phases. More generally, any appropriate circuit or method can be employed to decompose an input signal into a set of phases each one of which will independently drive a respective switching power amplifier between an off state and a saturation state. The Sigma-Delta modulator approach has the advantage of shifting the noise outside the operational bandwidth, and as such allows the noise to be very easily filtered off. However, it is to be understood chat other modulation methods will have their own noise characteristics which can be dealt with in their own way.

Any suitable hardware implementation can be used to build the architecture of FIG. 1. For example, for in one embodiment the Sigma-Delta modulator is on a first circuit, for example an ASIC or FPGA. The phase splitting function 16 is a second circuit. Each of the switching power amplifiers is a respective circuit, and the output filters, combiners and final output filters together are a separate circuit. This results in a total of N+3 circuits to build the architecture. Of course, it is to be understood that other combinations of functionality on different circuits could be employed. Furthermore, it is to be understood that the phase splitting function 16 could be implemented in software. Furthermore, some implementations of the Sigma-Delta modulator 10 could be implemented partially or completely in software. The filtering functions may be implemented using special purpose filters implemented in hardware, or may be implemented using general purpose filter blocks which are tuned to achieve the desired function, or other filtering technology can alternatively be employed.

It is noted that increasing N (the number of levels) improves noise performance without having to increase the over-sampling ratio as large as would be required in single bit Sigma-Delta applications. Preferably, N is minimized subject to a constraint of meeting the required noise performance and subject to $N \geq 3$.

As described briefly above, the application of Sigma-Delta modulators in digital to analog conversion is limited. Embodiments of the invention provide for implementing Sigma-Delta digital to analog converters constructed with multi-bit quantizers, by decoding the multi-level digital signal of the modulator into multiple binary phases. This simplifies the final digital to analog conversion step, which allows higher output sample rates to be achieved and opens additional applications which were not previously possible with a multi-level quantized output. Additionally, once decoded, these phases can be individually or collectively adjusted or corrected in either a purely feed forward sense or with output feedback to further enhance the performance of the modulator or a system in which it is implemented.

In embodiments of the invention, a final DAC stage in a Sigma-Delta DAC is eliminated and replaced with a bank of filters. Multi-phase outputs also enable new applications for Sigma-Delta modulators, such as multi-phase switched amplification and high performance multi-level operation at very high switching frequencies (i.e., GHz). Further processing of modulator outputs may also be provided to correct for impairments associated with subsequent processing operations.

As described in further detail below, digital to analog conversion is achieved in one embodiment by filtering two level phase signals independently, with each phase signal being treated similarly to a one bit Sigma-Delta DAC output, and then using an analog summing node to combine the multiple phases to reconstruct the signal. Such analog filtering performs two functions, analog reconstruction and removal of noise shaping. An analog summing node, referrers to herein primarily as a combiner, could be implemented as simply a connection of the outputs of multiple filters. This completely eliminates the DAC required in traditional multi-bit Sigma-Delta DACs described above.

In a preferred embodiment, filter characteristics of phase signal filters are matched. The matching or the filters can be readily achieved, for example, with integrated structures such as silicon, Surface Acoustic Wave (SAW), or Micro-electromechanical (MEM) filters. For a given filter characteristic, filtering of individual phases using matched filters before recombination and filtering of a combined multi-level signal are theoretically equivalent. Differences between these filtering techniques may arise, however, when there is filter mismatch between the phase signal filters.

In one embodiment, the number of levels car phase signals grows exponentially with a number of bits in a quantizer of a Sigma-Delta modulator, i.e., number of levels=$2^{NumberOfBits}$. However, quantizers need not necessarily have a number of levels exactly equal to a power of 2. Although there may be limitations on the number of phase signal filters in an implementation of the bank of filters, embodiments of the invention may provide significant advantage relative to conventional DAC techniques even with a small number of levels or phases and thus filters, such as 4, 8, or 16 filters, corresponding to 2, 3, or 4 bits, respectively.

Figure 5:
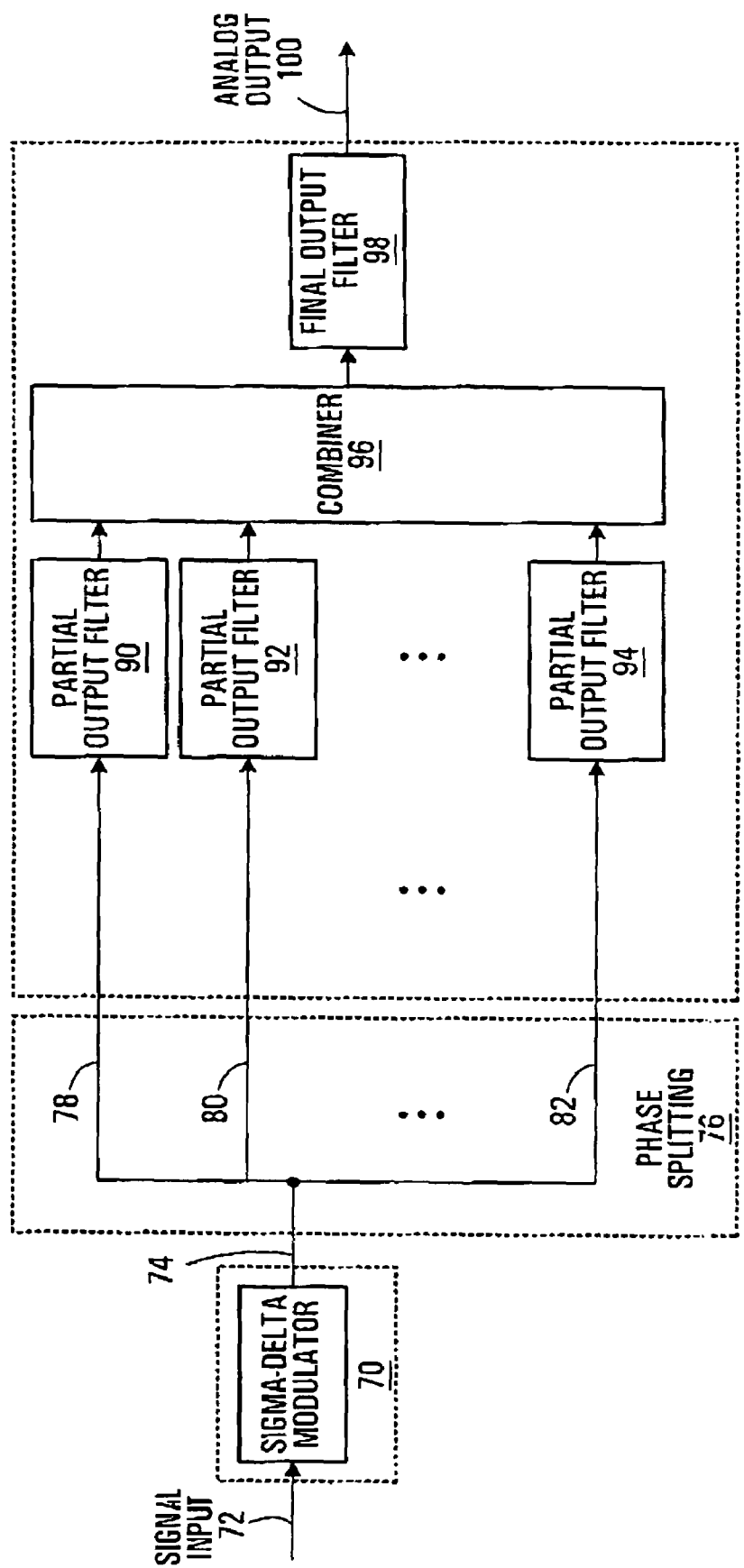
FIG. 5 is a block diagram of a digital to analog conversion system provided by another embodiment of the invention.

FIG. 5 is a block diagram of a digital to analog conversion system provided by another embodiment of the invention, using an N-level Sigma-Delta modulator. As in FIG. 1, a Sigma-Delta modulator 70 is connected to receive an input signal 72 and produce an N-level Sigma-Delta modulated output signal 74. A phase splitting function generally indicated at 76 produces a set of N−1, illustratively three, "phases" 78,80,82 from the signal 74. The N−1 phases 78,80,82 collectively sum to equal the Sigma-Delta modulated signal 74 at any instant. Each of the N−1 phases 78,80,82 is connected to the input of a respective one of partial output filters 90,92,94 (only three shown). The outputs of the partial output filters 90,92,94 are connected to inputs of a combiner 96 having an output connected to a final output filter 98 which produces the overall output 100.

From a comparison of FIGS. 1 and 5, it will be apparent that the converter of FIG. 5 is substantially similar to the amplifier of FIG. 1 with the exception of the switching power amplifiers 24, 26, 28. As those skilled in the art will appreciate, operation of the systems of FIGS. 1 and 5 is also substantially similar, and as such, the operation of FIG. 5 is described briefly below. Whereas the converter of FIG. 5 provides for digital to analog conversion, however, the amplifier of FIG. 1 also provides for power amplification.

In operation, the Sigma-Delta modulator 70 processes the input signal 72 to produce the Sigma-Delta modulated signal 74, and provides the benefit of noise shaping, allowing a reduction in the number of output levels relative to the input. Quantization noise is thus "pushed" out of the band of interest, allowing it to be eventually filtered off without negatively impacting the desired signal, as described above. The phase splitting function 76 processes the signal 74 to produce phase signals 78,80,82 which sum to equal the signal 74, each of the phase signals being a two state signal which is either on or off. The on states for the N−1 phases produced in the phase splitting block 76 are preferably equal. Common phase signal levels may be provided, for example, by decoding multiple levels in the signal 74 into multiple on/off phases which can then be used to drive parallel switches. Several examples of the phase splitting function 76 have been presented in detail above.

The phase signals 78,80,82 produced by the phase splitting function 76 are filtered in the partial output filters 90,92,94. The outputs of the partial output filters 90,92,94 are summed with combiner 96, which produces a combined signal which is output to the final output filter 98. The final output filter 98 filters out-of-band noise to produce the overall output 100.

Various illustrative examples of Sigma-Delta modulators, phase splitting functions, partial output filters, combiners, and final output filters have been described above and may be implemented in the system of FIG. 5.

It will therefore be apparent from the foregoing that the general architecture of FIG. 1 may be used in conjunction with power amplifiers, as shown, to provide for power amplification of input signals, or without power amplifiers, as shown in FIG. 5, to provide similar benefits for digital to analog conversion of input signals. In the system of FIG. 1, signals for driving the filters 30,32,34 are generated by power amplifiers 24,26,28, whereas in FIG. 5, the filters 90,92,94 are driven by the phase signals 78,80,82.

For digital to analog conversion applications, overall multi-level Sigma-Delta DAC structure and operation are simplified by replacing the traditional final DAC stage with a bank of filters and an analog summing node, which provides such advantages as allowing the application of Sigma-Delta DACs with multi-bit quantizers to drive power switches and increasing the final stage performance and ultimately the achievable operating frequency of Sigma-Delta DACs, for example. Multiple phases also reduce the effects of jitter-induced noise compared to a single multi-level output, beyond just the effect of reduced quantization levels achieved with multiple bits.

According to one embodiment of the invention, the Sigma-Delta modulator 70 is a first order modulator. However, in other embodiments, the modulator 70 may be of any desired order. Additionally, the basic concept of utilizing multiple phase outputs instead of multi-bit outputs from a Sigma-Delta modulator DAC can be applied to a wide variety of Sigma-Delta modulator structures, including higher order, MASH, parallel, time interleaved, and multistage (cascaded) modulators, for example.

Figure 6:
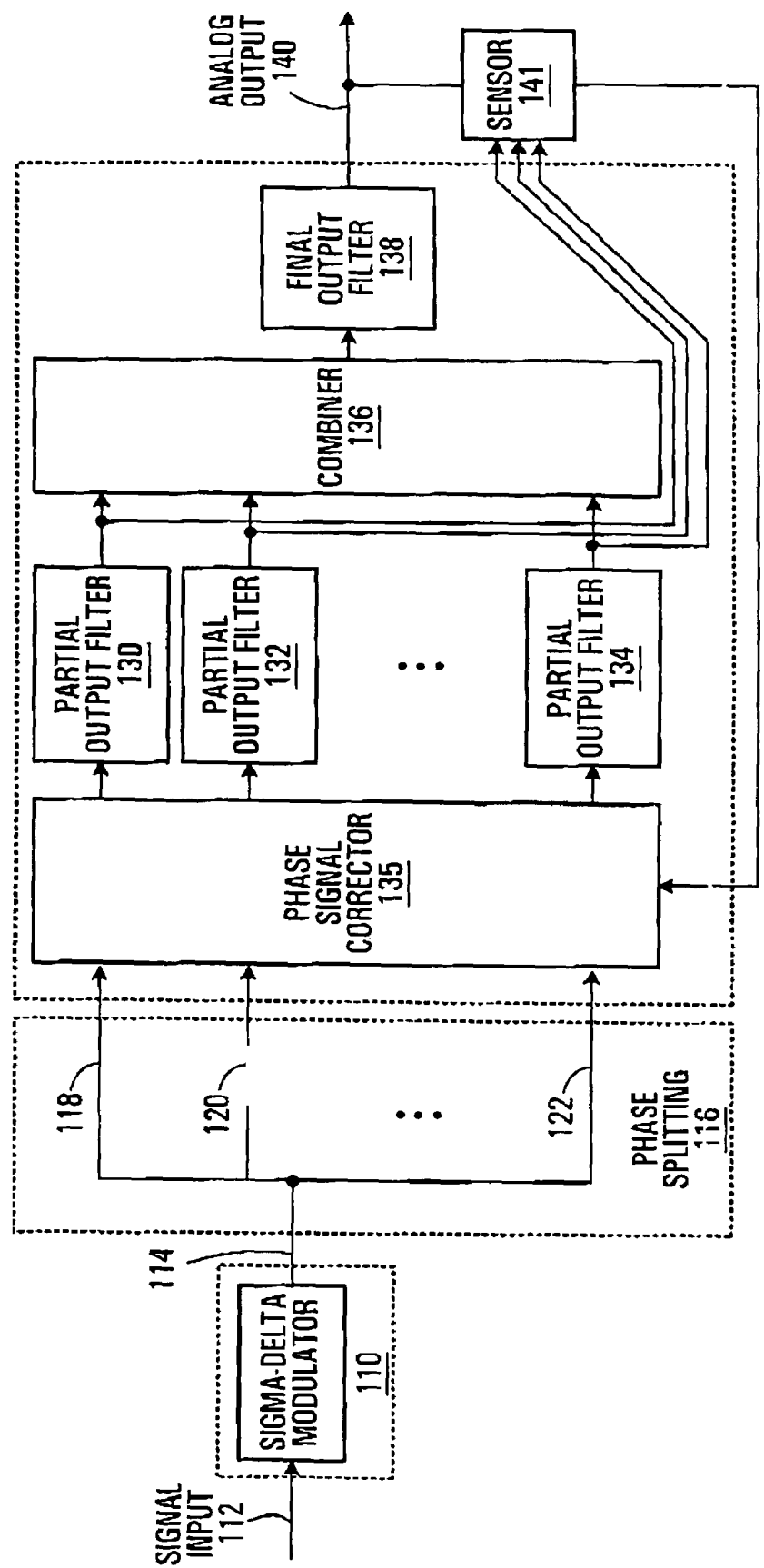
FIG. 6 is a block diagram of a digital to analog conversion system provided by a further embodiment of the invention.

FIG. 6 is a block diagram of a digital to analog conversion system provided by a further embodiment of the invention. The conversion system of FIG. 6 is substantially similar to that of FIG. 5, including a Sigma-Delta modulator 110 which receives an input signal 112 and produces; an output signal 114, partial output filters 130,132,134, a combiner 136 and a final output filter 138. However, the system of FIG. 6 provides the additional feature of phase correction in the phase corrector 135.

In the system of FIG. 6, the phase signals 118,120,122 are input to the phase corrector 135, which may adjust the phase signals and then output adjusted phase signals to the partial output filters 130,132,134. Adjustment of the phase signals 118,120,122 may compensate or at least reduce the effects of analog impairments in the recombination network of the filters 130,132,134, the combiner 136, and the final output filter 138. These impairments may include, for example, pulse extension, jitter, turn on/turn off delay, power sharing, and switching efficiency. Other impairments for which adjustment of the phase signals 118,120,122 may be desired will be apparent to those skilled in the art.

Considering the above example of pulse extension, an extension of an input pulse of duration x in the phase signals 118,120,122 to duration x+10% in a partial output filter 90,92,94 may cause amplitude distortion in the output signal 140. According to one technique, the phase corrector 135 determines incoming pulse lengths and modifies output pulses by a predetermined amount or factor to correct for or reduce the effects of pulse elongation. In another technique, the phase corrector 135 determines pulse length adjustment amounts by accessing a lookup table in a memory, for example. A lookup table may thus be used to provide a predetermined mapping between desired pulse lengths and adjusted pulse lengths, for example.

In the above embodiment, a lookup table provides an adjustment factor in the form of an adjusted pulse length to which a pulse in a phase signal is adjusted. According to other embodiments, an adjustment factor may specify a value by which a phase signal characteristic is to be adjusted, a gain or weight to be applied to a phase signal characteristic, or some combination thereof. Where phase signals are two state signal, phase signal characteristics other than amplitude, such as rise/fall times or turn on/turn off times are preferably adjusted. Further embodiments of the invention mall also or instead provide for phase signal amplitude adjustments. The invention is in no way restricted to any particular type of adjustment factor or phase signal adjustment scheme or operation.

Although shown as a single block in FIG. 6, it should be appreciated that the phase corrector 135 may individually or collectively adjust the phase signals 118,120,122.

Phase correction at 135 need not necessarily be based on characteristics of a phase signal itself. For example, analog impairments may be affected by temperature or other operating characteristics. The phase corrector 135 then determines phase adjustment factors on the basis of current operating characteristics. Operating characteristics may be determined by the phase corrector 135 itself or by an external component or device.

The above example of phase correction for pulse extension relates to a feed-forward correction scheme. In the embodiment shown in FIG. 6, the sensor 141 senses one or more characteristics of the output signal 140, outputs from the partial output filters 130,132,134, or both, and provides feedback to the phase corrector 135 for adaptive phase correction. Impairments of respective sections of the analog recombination network may thereby be measured. The sensor 141 may include multiple sensors for measuring characteristics of respective partial filter output signals and the output signal 140, and different types of sensor for measuring different signal characteristics, even though it is shown in FIG. 6 as a single component.

Adaptive phase correction may be preferred, for example, where a relationship between input signal characteristics and analog combination stage impairments is not known or is complicated, as is often the case. Characteristics of the actual output signal and/or partial output signals, determined by the sensor 141, may then be used lay the phase corrector 135 to adaptively determine adjustment factors, based on a predetermined algorithm, for example, for (one or more of the phase signals 118,120,122. In one embodiment, adjustment factors are mapped to one or more signal or operating conditions in a lookup table which is subsequently accessed by the phase corrector 135. In another embodiment, actual measured signal characteristics are used to adjust a model or algorithm used by the phase corrector 135 to determine adjustment factors.

Phase correction has been described above primarily in the context of adjusting a phase signal characteristic based on a measured or determined operating characteristic or a characteristic of a phase signal, partial output signal, or output signal. In other embodiments, multiple phase signal characteristics may be adjusted, adjustment factors may be determined on the basis of multiple signal and/or operating characteristics, and multiple adjustment factors, from different lookup tables for instance, may be combined or otherwise processed to determine an overall adjustment factor.

The sensor 141 or the phase corrector 131 may determine which particular signal characteristics are to be sensed and used for adaptive phase signal correction. Different characteristics may be used, for example, depending upon current signal or operating characteristics. For instance, characteristics of the output signals from the partial output filters 130,132,134 might be used to determine respective adjustment factors for the phase signals 118,120,122 to provide for more effective correction when relatively high output signal distortion is measured by the sensor 141, whereas a common adjustment factor might be used for all phase signals for lower output signal distortion levels. Of course, the invention is in no way limited to this particular adaptive adjustment technique. Other techniques may also be used.

The phase signal characteristics which are adjusted may also be adaptive, with certain characteristics being adjusted only under particular signal or operating conditions. Similarly, different characteristics may be taken into account for adjustment factor determination as signal or operating conditions change.

In one illustrative example described above, the sensor 141 and the phase corrector 135 provide adaptive phase signal correction for pulse extension. It should be appreciated that the effects of other analog impairments may be compensated or reduced in a similar manner by adjusting phase signal characteristics.

It should also be appreciated that feed-forward and feedback techniques are preferably not mutually exclusive. A signal converter may implement both feed-forward and feedback phase signal correction.

In addition, phase signal correction is not restricted only to signal conversion systems as shown in FIG. 6. The correction techniques described above may also be implemented in the amplifier of FIG. 1 and in other applications.

Numerous modifications and variations of the present invention are possible in light of the above teachings. It is therefore to be understood that within the scope of the appended claims, the invention may be practised otherwise than as specifically described herein.

For example, although shown as separate components in FIG. 6, the phase corrector 135 and the sensor 141 may be implemented as a single component which measures signal characteristics and adjusts phase signal characteristics to reduce the effects of impairments associated with subsequent phase signal processing.

The invention claimed is:

1. A method comprising:
   decomposing an input digital signal into a plurality of phase signals, each phase signal having a respective on level and off level;
   combining the phase signals to produce as an output signal an analog version of the input digital signal;
   wherein decomposing comprises:
   a) processing the input digital signal to produce a quantized signal having N levels, where N≧3; and
   b) performing a phase splitting function on the quantized signal to produce N–1 signals, the plurality of phase signals consisting of the N–1 signals.

2. A method according to claim 1, further comprising:
   adjusting at least one of the phase signals, prior to combining, to reduce effects of an impairment of the combining, to thereby produce at least one adjusted phase signal.

3. A method according to claim 2, wherein adjusting comprises determining an adjustment factor and applying the adjustment factor to the at least one of the phase signals.

4. A method according to claim 3, wherein determining comprises reading the adjustment factor from a lookup table.

5. A method according to claim 3, wherein determining comprises determining a characteristic of the output signal and determining the adjustment factor based on the characteristic.

6. A method according to claim 5, wherein determining comprises determining the adjustment factor based on the characteristic and an algorithm.

7. A method according to claim 5, further comprising: storing the adjustment factor in a lookup table.

8. A method according to claim 3, wherein determining comprises determining a characteristic of the at least one phase signal and determining the adjustment factor based on the characteristic.

9. A method according to claim 2, wherein the impairment comprises an impairment selected from the group consisting of: pulse extension, jitter, turn on/turn off delay, power sharing, and switching efficiency.

10. A method according to claim 2, wherein adjusting comprises adjusting a characteristic of the at least one phase signal.

11. A method according to claim 2, wherein adjusting comprises collectively adjusting the at least one phase signal.

12. A method according to claim 2, wherein adjusting comprises separately adjusting each of the at least one phase signal.

13. A method according to claim 1 wherein:
processing the input digital signal to produce a quantized signal having N levels, where $N \geq 3$ comprises processing the signal with an N level Sigma-Delta modulator.

14. A method according to claim 1 wherein decomposing the input digital signal into the plurality of phase signals is done subject to a minimum on time constraint for each phase signal.

15. A method according to claim 1 wherein decomposing the input digital signal into the plurality of phase signals is done subject to a minimum off time constraint for each phase signal.

16. A method according to claim 1 wherein decomposing the input digital signal into the plurality of phase signals is done subject to a minimum and/or maximum time between transitions.

17. A method according to claim 1 wherein decomposing the input digital signal into the plurality of phase signals is done in a manner which substantially equalizes numbers of transitions between the plurality of phase signals.

18. A method according to claim 13 wherein performing a phase splitting function on the quantized signal to produce N−1 signals, the plurality of phase signals consisting of the N−1 signals, comprises:
for each quantized signal output "currentIn", if currentIn is the same as a previously processed quantized signal output "lastIn", making no changes to the plurality of phase signals;
if currentIn is less than lastIn, determining a set X of signals that are currently off are determined, from that set X, selecting the signals with the least number of switching events and activating the selected signals;
if currentIn is greater than lastIn, determining a set X of signals that are currently, from the set X, selecting the phases with the least number of switching events and deactivating the selected signals.

19. A method according to claim 1 further comprising:
performing a partial filtering function on each phase signal prior to combining the phase signals, and performing a final filtering function on the output signal.

20. A method according to claim 1 further comprising:
performing a filtering function on each phase signal prior to combining the phase signals.

21. A method according to claim 1 further comprising:
performing a final filtering function on the output signal.

22. The method of claim 2, further comprising:
amplifying each of the plurality of phase signals with a respective switching power amplifier to produce a respective amplified signal,
wherein adjusting comprises adjusting at least one of the amplified signals.

23. The method of claim 2, further comprising:
amplifying each of the at least one adjusted phase signals and the plurality of phase signals other than the at least one phase signal with a respective switching power amplifier to produce a respective amplified signal,
wherein combining comprises combining the amplified signals to produce as the output signal an amplified analog version of the input digital signal.

24. A system comprising:
means for decomposing a digital signal into a plurality of phase signals, each phase signal having a respective on level and off level;
means for combining the phase signals to produce as an output signal an analog version of the digital signal;
wherein the means for decomposing comprises:
a) means for processing the digital signal to produce a quantized signal having N levels, where $N \geq 3$; and
b) means for performing a phase splitting function on the quantized signal to produce N−1 signals, the plurality of phase signals consisting of the N−1 signals.

25. An apparatus comprising:
a signal decomposing circuit adapted to decompose an input digital signal into a plurality of phase signals, each phase signal having a respective on level and off level;
a combiner adapted to combine the phase signals to produce as an output signal an analog version of the input digital signal;
wherein the signal decomposing circuit comprises:
a modulator which produces a quantized signal having N levels, where $N \geq 3$;
a phase splitting function adapted to process the quantized signal to produce N−1 signals, the plurality of phase signals consisting of the N−1 signals.

26. An apparatus according to claim 25, further comprising:
a phase corrector adapted to adjust at least one of the phase signals to reduce effects of an impairment of the combining, to thereby produce at least one adjusted phase signal.

27. An apparatus according to claim 26, wherein the phase corrector is adapted to adjust the at least one of the phase signals by determining an adjustment factor and applying the adjustment factor to the at least one of the phase signals.

28. An apparatus according to claim 27, further comprising:
a memory,
wherein the phase corrector is adapted to determine the adjustment factor by reading the adjustment factor from a lockup table in the memory.

29. An apparatus according to claim 27, wherein the phase corrector is further adapted to determine a characteristic of the output signal and to determine the adjustment factor based on the characteristic.

30. An apparatus according to claim 29, further comprising:

a sensor for determining the characteristic and providing the characteristic to the phase corrector.

31. An apparatus according to claim 29, wherein the phase corrector is further adapted to determine the adjustment factor based on the characteristic and an algorithm.

32. An apparatus according to claim 29 further comprising:
a memory,
wherein the phase corrector is further adapted to store the adjustment factor in a lookup table in the memory.

33. An apparatus according to claim 27, wherein the phase corrector is further adapted to determine a characteristic of the at least one phase signal and to determine the adjustment factor based on the characteristic.

34. An apparatus according to claim 26, wherein the impairment comprises an impairment selected from the group consisting of: pulse extension, jitter, turn on/turn off delay, power sharing, and switching efficiency.

35. An apparatus according to claim 26, wherein the phase corrector is adapted to adjust a characteristic of the at least one phase signal.

36. An apparatus according to claim 26, wherein the phase corrector is adapted to collectively adjust the at least one phase signal.

37. An apparatus according to claim 26, wherein the phase corrector is adapted to separately adjust each of the at least one phase signal.

38. An apparatus according to claim 25 wherein the modulator is an N level Sigma-Delta modulator.

39. An apparatus according to claim 25 wherein the signal decomposing circuit decomposes the input digital signal into the plurality of phase signals in a manner which substantially equalizes numbers of transitions between the phase signals.

40. An apparatus according to claim 25 wherein the signal decomposing circuit decomposes the input digital signal subject to a minimum on time constraint for each phase signal.

41. An apparatus according to claim 25 wherein the signal decomposing circuit decomposes the input digital signal subject to a minimum off time constraint for each phase signal.

42. An apparatus according to claim 25 wherein the signal decomposing circuit decomposes the signal subject to a minimum and/or maximum time between transitions.

43. An apparatus according to claim 38 wherein the phase splitting function is adapted to:
for each quantized signal output "currentIn", if currentIn is the same as a previously processed quantized signal output "lastIn", make no changes to the plurality of phase signals;
if currentIn is less than lastIn, determine a set X of signals that are currently off are determined, from that set X, select the signals with the least number of switching events and activate the selected signals;
if currentIn is greater than lastIn, determine a set X of signals that are currently, from the set X, select the phases with the least number of switching events and deactivate the selected signals.

44. A method comprising:
decomposing an input signal into a plurality of two state signals, each two state signal having a respective on level and off level;
adjusting the two state signals to reduce effects of a subsequent processing operation, to thereby produce at least one adjusted phase signal;
wherein decomposing comprises;
a) processing the input signal to produce a quantized signal having N levels, where $N \geq 3$; and
b) performing a phase splitting function on the quantized signal to produce N−1 signals, the plurality of two state signals consisting of the N−1 signals.

45. A method according to claim 44, further comprising:
amplifying each of the adjusted two state signals with a respective switching power amplifier to produce a respective amplified signal.

46. A method according to claim 44, further comprising:
amplifying each of the two state signals with a respective switching power amplifier to produce a respective amplified signal,
wherein adjusting comprises adjusting the amplified signals.

47. A method according to claim 44, wherein the subsequent processing operation comprises combining the adjusted signals.

48. A method according to claim 44, wherein adjusting comprises:
determining an adjustment factor; and
applying the adjustment factor to the two state signals.

49. A method according to claim 44, wherein adjusting comprises:
determining respective adjustment factors for the two state signals; and
applying the respective adjustment factors to the two state signals.

50. A method comprising:
decomposing an input digital signal into a plurality of phase signals, each phase signal having a respective on level and off level;
combining the phase signals to produce as an output signal an analog version of the input digital signal;
wherein decomposing comprises:
a) processing the input digital signal to produce a quantized signal having N levels, where $N \geq 3$; and
b) performing a phase splitting function on the quantized signal to produce the plurality of phase signals.

51. An apparatus comprising:
a signal decomposing circuit adapted to decompose an input digital signal into a plurality of phase signals, each phase signal having a respective on level and off level;
a combiner adapted to combine the phase signals to produce as an output signal an analog version of the input digital signal;
wherein the signal decomposing circuit comprises:
a modulator which produces a quantized signal having N levels, where $N \geq 3$;
a phase splitting function adapted to process the quantized signal to produce the plurality of phase signals.

* * * * *

UNITED STATES PATENT AND TRADEMARK OFFICE
CERTIFICATE OF CORRECTION

PATENT NO. : 7,081,793 B2
APPLICATION NO. : 10/858079
DATED : July 25, 2006
INVENTOR(S) : Bradley John Morris et al.

It is certified that error appears in the above-identified patent and that said Letters Patent is hereby corrected as shown below:

Column 12, line 4, "...phase corrector 131..." should be --...phase corrector 135...--.

Column 14, claim 28, line 61, "...a lockup table..." should be --...a lookup table...--.

Signed and Sealed this

Twenty-third Day of January, 2007

JON W. DUDAS
*Director of the United States Patent and Trademark Office*